(12) United States Patent
Gupta et al.

(10) Patent No.: US 8,693,267 B2
(45) Date of Patent: Apr. 8, 2014

(54) SIGNAL SYNCHRONIZATION IN MULTI-VOLTAGE DOMAINS

(75) Inventors: Siddharth Gupta, Uttar Pradesh (IN); Rakesh Kumar Sinha, VIII-Mozaffara Post Bardin (IN); Vamsi Krishna Gullapalli, Krishna Dist (IN); Dibya Dipti, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 633 days.

(21) Appl. No.: 12/646,827

(22) Filed: Dec. 23, 2009

(65) Prior Publication Data

US 2010/0165754 A1 Jul. 1, 2010

(30) Foreign Application Priority Data

Dec. 24, 2008 (IN) .......................... 2939/DEL/2008

(51) Int. Cl.
*G11C 7/00* (2006.01)

(52) U.S. Cl.
USPC .................................................. 365/189.11

(58) Field of Classification Search
USPC ...................................................... 365/189.11
See application file for complete search history.

(56) References Cited

U.S. PATENT DOCUMENTS

2007/0002636 A1* 1/2007 Campbell et al. ........ 365/189.04

* cited by examiner

*Primary Examiner* — Anthan Tran
(74) *Attorney, Agent, or Firm* — Munck Wilson Mandala, LLP

(57) ABSTRACT

A system and a method to improve signal synchronization in a plurality of signal paths traversing multiple voltage domains. According to an embodiment of the present disclosure a memory arrangement is preferred for signal synchronization. All read/write and clocks signals and other control signals are driven to periphery supply (Vp) levels, except wordline (WL[i]) signals which are driven at core supply (Vc) level. By doing so, lower average and peak current consumption associated with core supply (Vc) is achieved with constant delays and maintaining required signal synchronization in the signal paths traversing multiple voltage domains.

20 Claims, 9 Drawing Sheets

SIGNAL SYNCHRONIZATION IN MULTI-VOLTAGE DOMAINS

CROSS-REFERENCE TO RELATED APPLICATIONS

The present application is related to Indian Patent Application No. 2939/Del/2008, filed Dec. 24, 2008, entitled "SIGNAL SYNCHRONIZATION IN MULTI-VOLTAGE DOMAINS". Indian Patent Application No. 2939/Del/2008 is assigned to the assignee of the present application and is hereby incorporated by reference into the present disclosure as if fully set forth herein. The present application hereby claims priority under U.S.C. §119(a) to Indian Patent Application No. 2939/Del/2008.

TECHNICAL FIELD

The present disclosure relates to integrated circuits and, more specifically, to provide improvement in signal synchronization for a plurality of signal paths traversing multiple voltage domains.

BACKGROUND OF THE DISCLOSURE

Technological advancements in the field of chip-designing have resulted in miniaturization of electronic devices present on an integrated circuit. Managing power supply in such electronic devices requires computing features with rich functionality, particularly when supply voltages used for powering the electronic devices decreases below a certain voltage level. This reduced supply voltage gives rise to inability to read and write memory.

BRIEF DESCRIPTION OF THE DRAWINGS

For a more complete understanding of this disclosure and its features, reference is now made to the following description, taken in conjunction with the accompanying drawings, in which.

Figure 1:
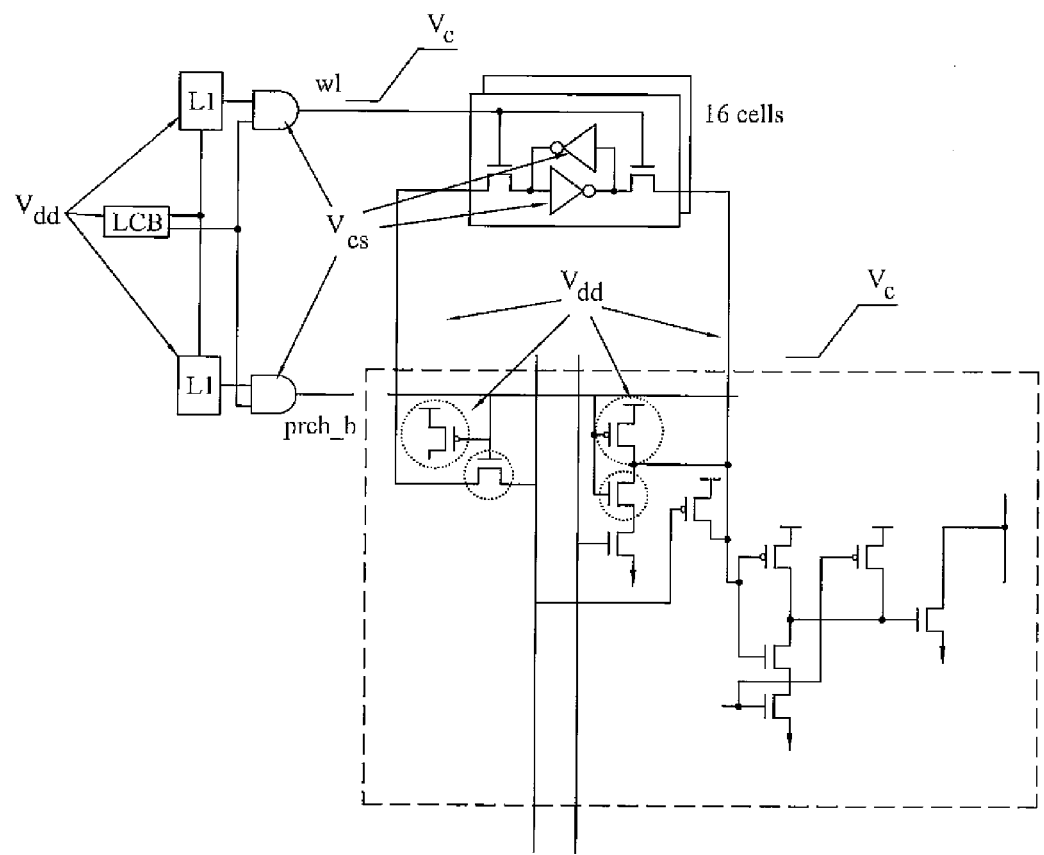
FIG. 1 illustrates a separate dual power supply for SRAM arrays to improve stability and tracking performance using an elevated voltage level.

Other technical features may be readily apparent to one skilled in the art from the following figures, descriptions and claims.

DETAILED DESCRIPTION

The embodiments of the present disclosure will be described in detail with reference to the accompanying drawings. However, the present disclosure is not limited to these embodiments. The present disclosure can be modified in various forms. The embodiments of the present disclosure described herein are only provided to explain more clearly the present disclosure to the ordinarily skilled in the art. In the accompanying drawings, like reference numerals are used to indicate like components.

The specification may refer to "an", "one" or "some" embodiment(s) in several locations. This does not necessarily imply that each such reference is to the same embodiment(s), or that the feature only applies to a single embodiment. Single features of different embodiments may also be combined to provide other embodiments.

As used herein, the singular forms "a", "an" and "the" are intended to include the plural forms as well, unless expressly stated otherwise. It will be further understood that the terms "includes", "comprises", "including" and/or "comprising" when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include operatively connected or coupled. As used herein, the term "and/or" includes any and all combinations and arrangements of one or more of the associated listed items.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"Wireless communication system" includes any communication system or any combination of different communication systems. The communication system may be a fixed communication system or a wireless communication system or a communication system utilizing both fixed networks and wireless networks. The protocols used the specifications of communication systems, servers and user terminals, especially in wireless communication, develop rapidly. Such development may require extra changes to an embodiment. Therefore, all words and expressions should be interpreted broadly and they are intended to illustrate, not to restrict the embodiment.

The figures depict a simplified structure only showing some elements and functional entities, all being logical units whose implementation may differ from what is shown. The connections shown are logical connections; the actual physical connections may be different. It is apparent to a person skilled in the art that the structure may also comprise other functions and structures. It should be appreciated that the functions, structures, elements and the protocols used in communication are irrelevant to the present disclosure. Therefore, they need not be discussed in more detail here.

Also, all logical units described and depicted in the figures include the software and/or hardware components required for the unit to function. Further, each unit may comprise within itself one or more components which are implicitly understood. These components may be operatively coupled to each other and be configured to communicate with each other to perform the function of the said unit.

The present disclosure describes a system and a method to improve signal synchronization in a plurality of signal paths traversing multiple voltage domains.

According to an embodiment of the present disclosure a memory arrangement is preferred for signal synchronization in multi-voltage domain. All read/write and clocks signals and other control signals are driven to periphery supply (Vp) levels, except wordline (WL[i]) signals which are driven at core supply (Vc) level. By doing so, lower average and peak current consumption associated with core supply (Vc) is achieved with constant delays and maintaining required signal synchronization in the signal paths traversing multiple voltage domains.

Another embodiment of the present disclosure illustrates, a multiple voltage domain system, comprising: a control signal generator providing a plurality of control signals, at least a few of which need to be synchronized, said control signal generator being configured to cause those of said control signals that require to be synchronized to traverse identical voltage domains through identical level shifters.

Another embodiment of the present disclosure illustrates, a memory device comprising multiple voltage domain system, said device comprising: a control signal generator providing a plurality of control signals, at least a few of which need to be synchronized, said control signal generator being configured to cause those of said control signals that require to be synchronized to traverse identical voltage domains through identical level shifters.

Another embodiment of the present disclosure illustrates a method for signal synchronization in a multi-voltage system, said method comprising: providing a plurality of control signals, at least a few of which need to be synchronized; and setting up said control signals that require to be synchronized to traverse identical voltage domains through identical level-shift stages.

Further, when a plurality of signals traverses multiple voltage domains their trackability performance is more reduced because of unsynchronized signal paths. The desynchronization is mainly because of the delays present in those signals.

In mono-supply architectures for memories, the supply levels cannot be scaled down significantly at low voltage levels due to write-ability limitation. Although, in the recent past, write-assist circuit techniques such as negative bit line, voltage lowering and WL (write-line) boosting have been used to address issues of voltage scaling, but these proposed solutions result in increased complexity than dynamic memory power scaling. Consequently, such problems existing in memories were mitigated through the split core-periphery supply or dual power supply architectures.

In split core-periphery supply architectures, word lines were generally driven at an elevated core supply (Vc) level for memory cell by level-shifting up the periphery signals (such as precharge signals, sense amplifier signals, I/O signals etc.) to the core supply power level due to which better writeability and read current is achieved. However, this increases the overall dynamic power due to unwanted short-circuit currents. Further, the coherence between overall dynamic power and periphery power supply (Vp) is reduced, leading in degradation of timing performance and tracking. Therefore, scaling down of the periphery power supply (Vp) is highly unacceptable.

Alternatively, core supply levels were also managed through dedicated voltage regulators such as LDOs (Low drop-out regulators). This arrangement aided to manage the core supply and it's variability but with restricted average and peak currents for the memory associated with it. The larger value of the currents also increases the capacitance of the decoupling capacitance coupled to the voltage regulators (or LDO). This again resulted in degradation of timing performance and tracking.

FIG. 1 illustrates a separate dual power supply for SRAM arrays to improve stability and tracking performance using an elevated voltage level. In this arrangement level-shifting is provided to both wordline (WL) and BL-Precharge (Prch_B) with the same voltage i.e. the core supply voltage (Vc). This avoids tracking losses by reducing the delay between CLK-WL and CLK-PCH. But fails to address the increase in peak and average current consumption associated with core supply and precludes the handling of a large number of memory instances by a single on-chip voltage regulator.

Figure 2:
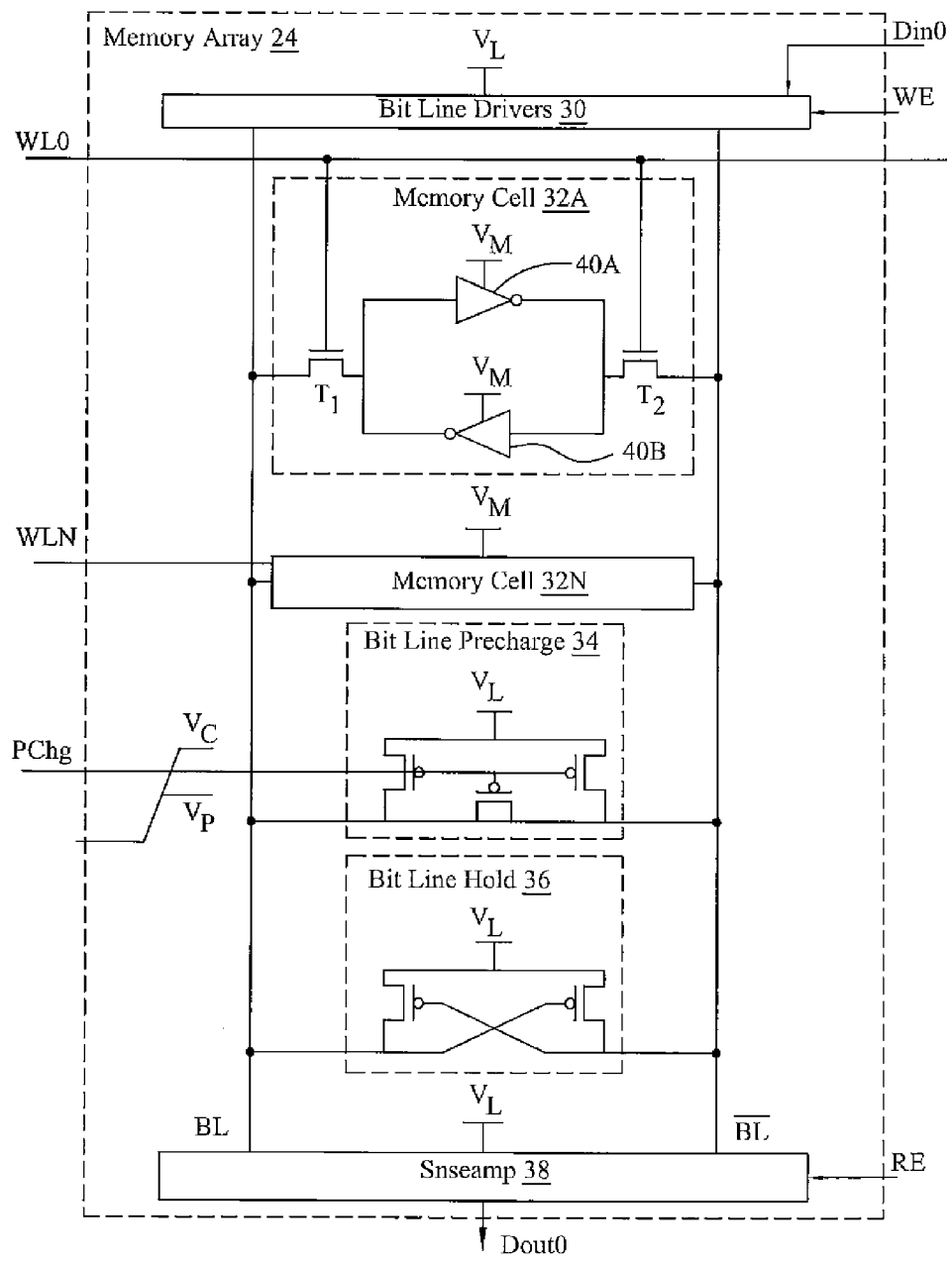
FIG. 2 illustrates separate power supplies for core and periphery circuit in a memory array.

FIG. 2 illustrates separate power supplies for core and periphery circuit in a memory array. In one embodiment, the wordline are level-shifted at a high voltage level while maintaining the BL-Precharge (Prch_B) at a low voltage level. In another embodiment, the BL-Precharge (Prch_B) is level-shifted at low voltage and the wordline (WL) is maintained at high voltage level. However, this does not control the increase in peak and average current consumption associated with core supply and even the tracking losses.

Figure 3:
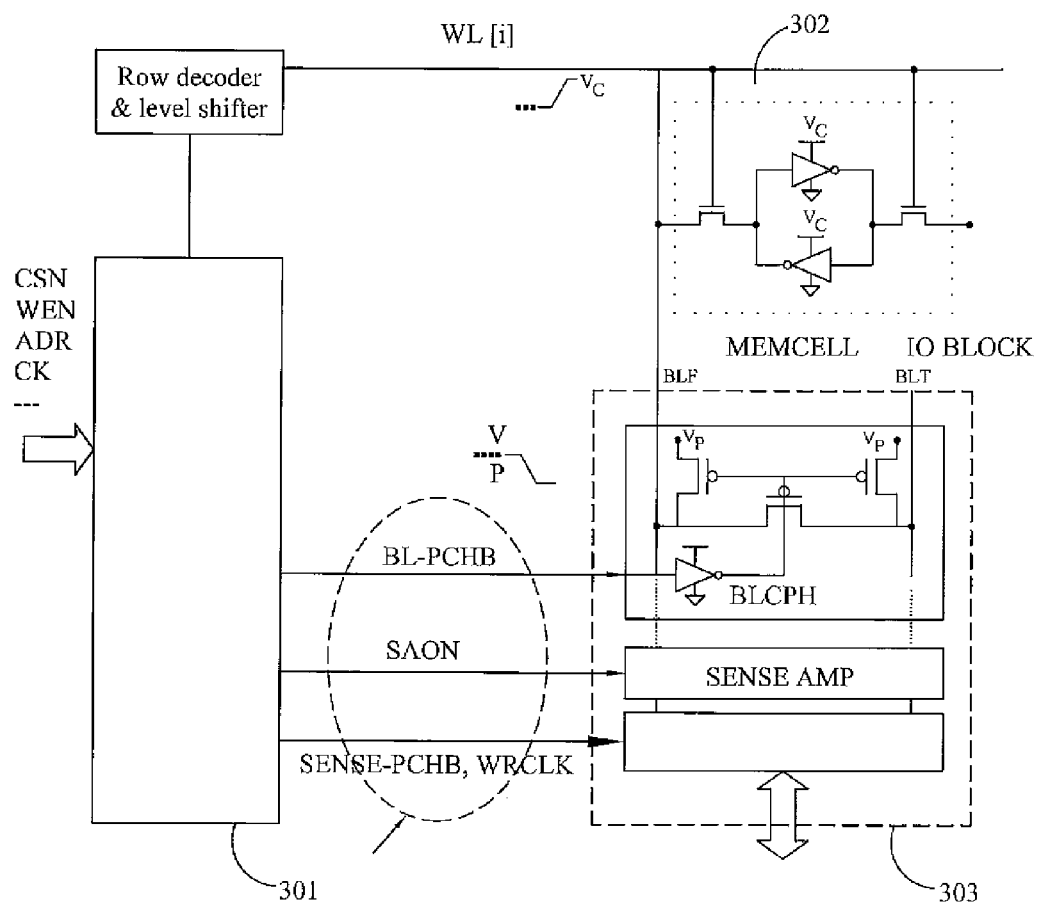
FIG. 3 illustrates a schematic diagram of an integrated circuit according to an embodiment of the present disclosure.

FIG. 3 illustrates a schematic diagram of an integrated circuit according to an embodiment of the present disclosure. The integrated circuit 301 comprises a memory circuit 302, a periphery circuit 303, and a control signal generator 304 configured with the memory circuit 302 and the peripheral circuit 303. The peripheral circuits 303, in the present disclosure are input/output circuits, precharge circuits etc. Further, the control signal generator 304 is inserted in the path of the various control signals for the memory circuit 302 and the peripheral circuit 303 such as CLK_READ, CLK_WRITE, PCH, SENSE CLK, WRGIOCK to provide predetermined boosting.

Figure 4:
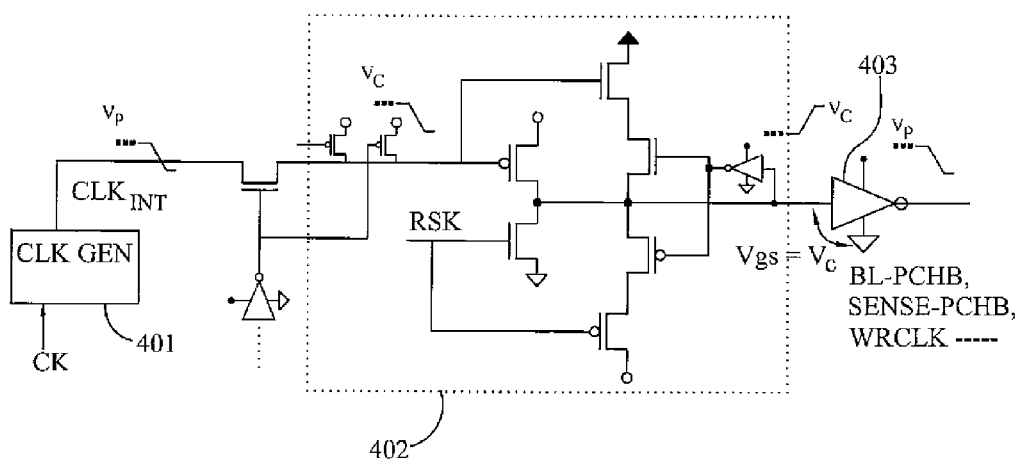
FIG. 4 illustrates implementation of a control signal generator according to an embodiment of the present disclosure.

FIG. 4 illustrates a control signal generator according to an embodiment of the present disclosure. The control signal generator 301 comprises a clock generator 401 configured with an inbuilt level shifter 402. This level shifter 402 is a RS latch. The level shifter 402 converts input signal from periphery supply voltage level (Vp) to core supply (Vc) voltage level. The level-shifted output of level shifter 402 is coupled to the gate of the clock drivers 403. The output of the driver 403 is further coupled to the gates of periphery devices. This arrangement increases the gate-drive of the clock drivers while the signals are still placed in the periphery supply domain.

In the present disclosure, the clock generator 301 generates a clock of voltage value Vp (periphery voltage). This clock is level-shifted to Vc (core voltage) from Vp (periphery voltage) through a level shifter. This level shifted signal boosts the read/write signals and driver signals by maintaining the gate voltages (Vgs) of the NMOS transistor in the periphery driver circuit and the PMOS transistor of the memory driver circuit at Vc (core voltage).

Further, in the present disclosure the gate-drive strength of PMOS transistor present in the memory circuit driver and the gate-drive strength of NMOS transistor in the periphery circuit driver for read/write signals effectively remains at the same voltage i.e. Vc (core voltage), even for the case when periphery supply voltage level (Vp) is much less than core supply level (Vc) i.e. (Vp<Vc). Hence, according to the present embodiment the relative difference in delays (CLK-WL, CLK-PCH, CLK-SENSE, etc) is effectively remains constant and does not modulate with the periphery voltage (Vp) specifically in the dynamic voltage scaling (DVS) mode.

Thus, this mechanism modulates the delays coherently with respect to each other and solves several issues such as trackability, maintains lower peak/average current, reduces timing degradation and power losses.

Figure 5:
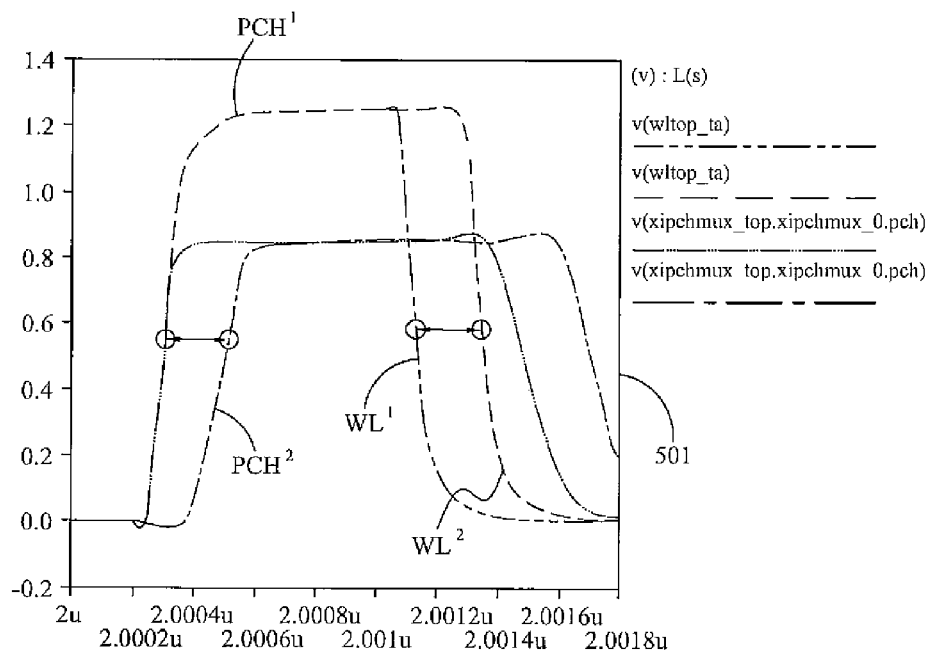
FIG. 5 illustrates the trackability performance in a memory system according to an embodiment of the present disclosure.
Figure 5:
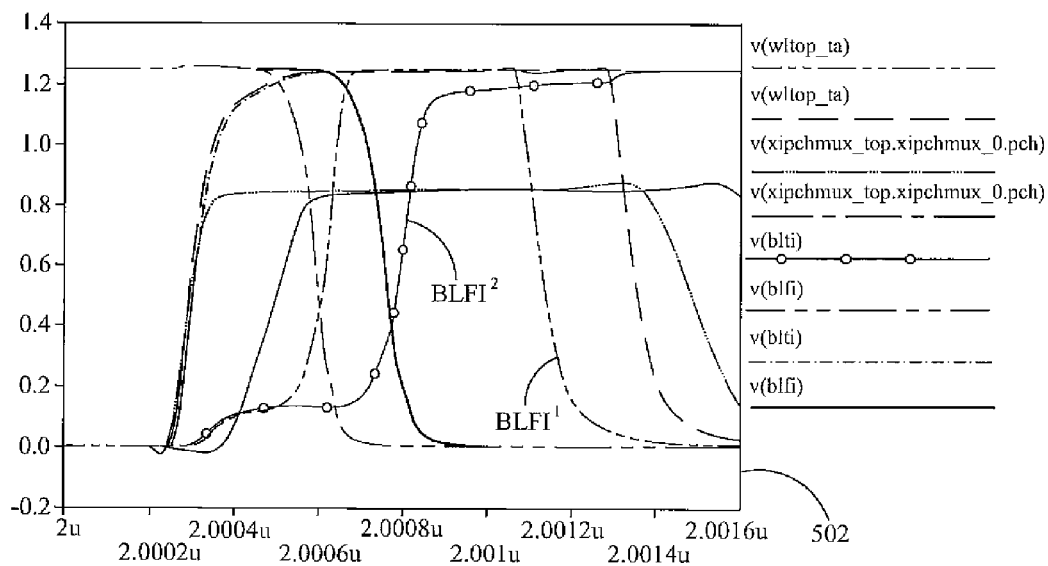

FIG. 5 illustrates the trackability performance in a memory system according to an embodiment of the present disclosure. The graph 501 shows the improvement in the readability for the signal waveforms $PCH^1$ and $WL^1$ according to the preferred embodiment whereas; the waveform $PCH^2$ and $WL^2$ shows the readability without the preferred embodiment. In reality, improving power scaling and making it in coherence to scaling down of the periphery voltage reduces the short circuit and parasitic component in case of read and write. This results in better tracking. The graph 502 shows the improvement in the writability implementation for the signal waveforms $BLFI^1$ using the preferred embodiment where conformal pulse widths of the waveforms $BLFI^1$ shows the write stability. Whereas, the waveform $BLFI^2$ (where BLFI is an internal node of the memory cell) shows the writability implementation without the preferred embodiment, where the elongated pulse widths in the waveforms $BLFI^2$ shows read or write instability.

Figure 6:
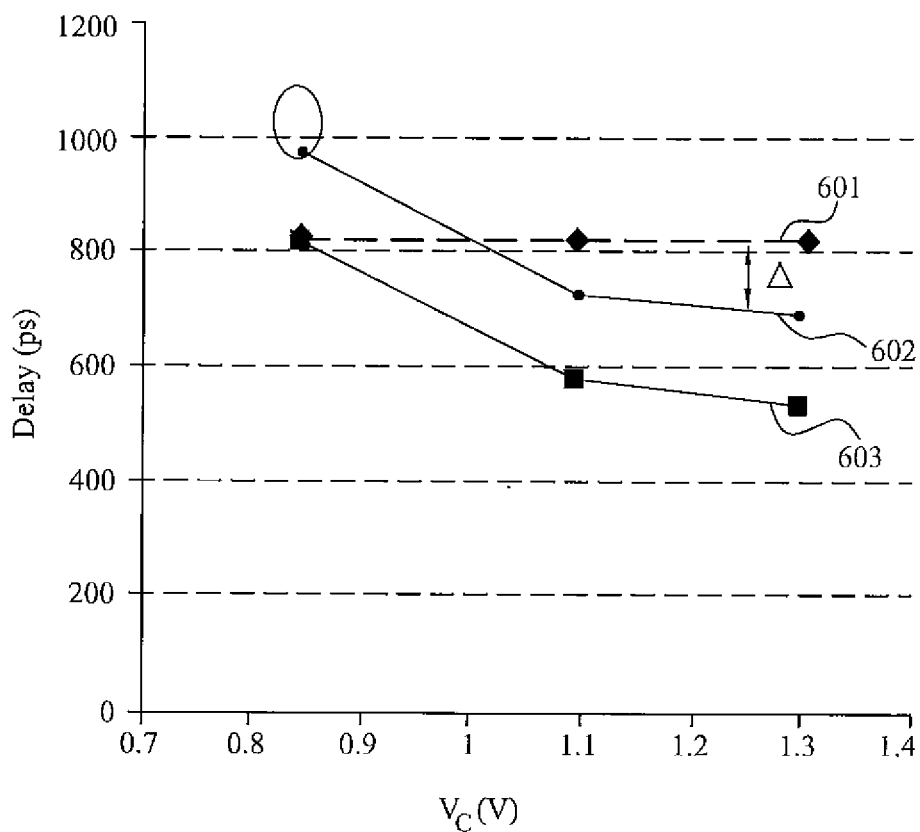
FIG. 6 illustrates timing degradation improvement in a memory system according to an embodiment of the present disclosure.

FIG. 6 illustrates timing degradation improvement in memory systems according to an embodiment of the present disclosure. As shown in the graph, the delay movements plotted against core supply voltage (Vc) are "CLK-WL" 601 and "CLK-PCH" (602 & 603). In the preferred embodiment, boosting or level-shifting of the core supply and periphery supply levels ensures that delays CLK-WL 601 and CLK-PCH 602 are well tracked with each other i.e. the basic timing difference between them does not degrade or improve. However, in absence of level shifter, the timing difference between the delays CLK-WL 601 and CLK-PCH 603 degrades, resulting in high time loss.

Figure 7:
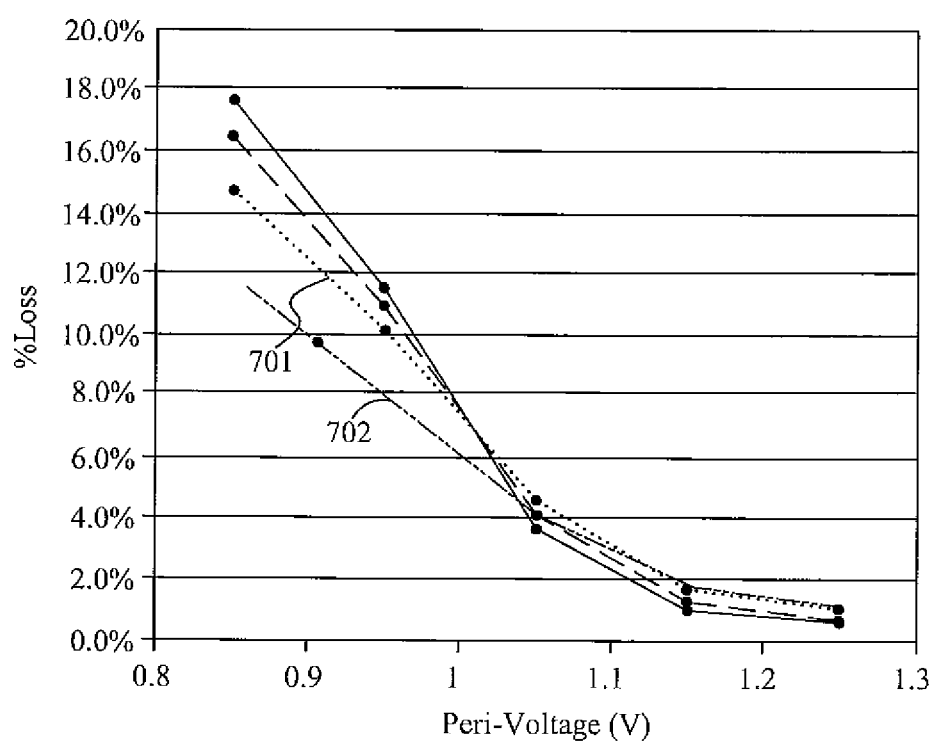
FIG. 7 illustrates power gain curve in a memory system according to an embodiment of the present disclosure.

FIG. 7 illustrates a power gain curve according to an embodiment of the present disclosure. 701 shows the reduced losses in the periphery dynamic power after the level shifting or boosting whereas 702 shows the periphery dynamic power (in %) achieved without level shifting or boosting (in %).

Figure 8:
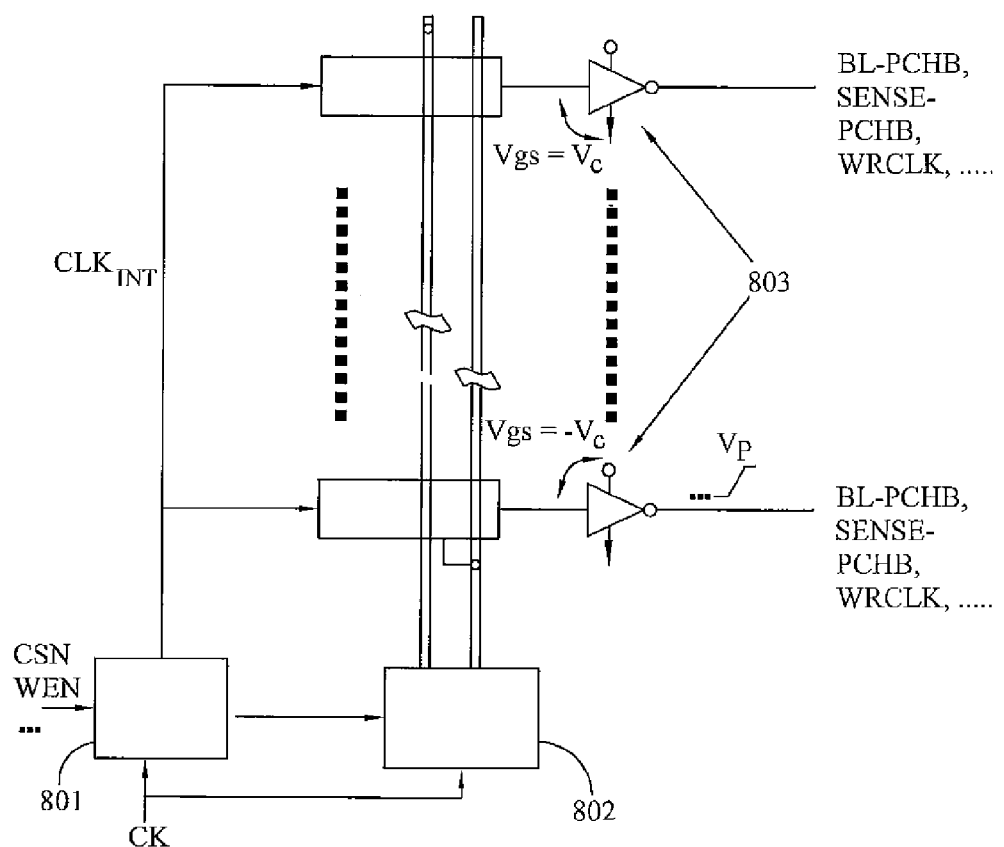
FIG. 8 illustrates implementation of a control signal generator according to another embodiment of the present disclosure.

FIG. 8 illustrates a level shifter according to another embodiment of the present disclosure. A clock generator 801 is configured with an inbuilt charge pump 802. This charge pump 802 is a level shifter which converts the input signal from periphery supply level (VP) to core supply (VC) level. The charge pump 802 output VC is provided to the drivers 803. The output of the driver 803 is further coupled to gates of the periphery devices.

Figure 9:
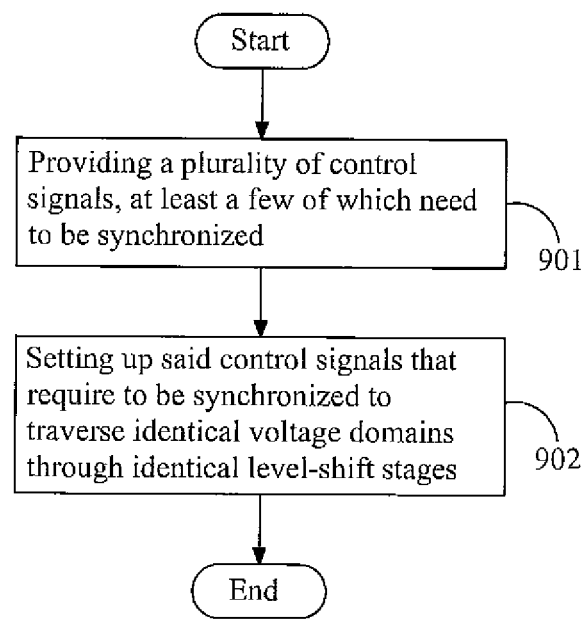
FIG. 9 illustrates a flow chart of a method according to the present disclosure.

Embodiments of the method for signal synchronization in multi-voltage domains are described in FIG. 9. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 9 illustrates a flow chart of a method of signal synchronization in multiple voltage domains according to the present disclosure. The control signal generator in step 901 provides a plurality of control signals, at least a few of which need to be synchronized. Further in step 902, said control signals that require to be synchronized are set to traverse identical voltage domains through identical level-shift stages.

The present disclosure for signal synchronization in multiple voltage domains provides a mechanism to maintain the signal paths with constant delays or providing a mechanism to modulate the delays coherently with respect to each other. All this ensures trackability, maintains constant peak/average current, and reduces timing degradation and power losses in signal paths traversing multiple voltage domains.

The present disclosure is applicable to all types of on-chip and off chip memories used in various in digital electronic circuitry, or in hardware, firmware, or in computer hardware, firmware, software, or in combination thereof. Apparatus of the present disclosure can be implemented in a computer program product tangibly embodied in a machine-readable storage device for execution by a programmable processor; and methods actions can be performed by a programmable processor executing a program of instructions to perform functions of the present disclosure by operating on input data and generating output. The present disclosure can be implemented advantageously on a programmable system including at least one input device, and at least one output device. Each computer program can be implemented in a high-level procedural or object-oriented programming language or in assembly or machine language, if desired; and in any case, the language can be a compiled or interpreted language.

Suitable processors include, by way of example, both general and specific microprocessors. Generally, a processor will receive instructions and data from a read-only memory and/or a random access memory. Generally, a computer will include one or more mass storage devices for storing data file; such devices include magnetic disks and cards, such as internal hard disks, and removable disks and cards; magneto-optical disks; and optical disks. Storage devices suitable for tangibly embodying computer program instructions and data include all forms of volatile and non-volatile memory, including by way of example semiconductor memory devices, such as EPROM, EEPROM, and flash memory devices; magnetic disks such as internal hard disks and removable disks; magneto-optical disks; CD-ROM and DVD-ROM disks; and buffer circuits such as latches and/or flip flops. Any of the foregoing can be supplemented by, or incorporated in ASICs (application-specific integrated circuits), FPGAs (field-programmable gate arrays) and/or DSPs.

It will be apparent to those having ordinary skill in this art that various modifications and variations may be made to the embodiments disclosed herein, consistent with the present disclosure, without departing from the spirit and scope of the present disclosure.

Other embodiments consistent with the present disclosure will become apparent from consideration of the specification and the practice of the description disclosed herein.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A multiple voltage domain system, comprising:
   a control signal generator configured to provide a plurality of control signals for a memory circuit and a peripheral circuit,
   wherein the control signal generator is configured to substantially synchronize at least two of the control signals including a first control signal having a first voltage level and a second control signal having a second voltage level lower than the first voltage level,
   wherein the control signal generator is configured to synchronize the first and second control signals by forcing the first and second control signals to traverse a voltage domain up to the first voltage level and then shifting the second control signal down to the second voltage level through at least one level shifter,
   wherein the first control signal is a control signal for the memory circuit and the second control signal is a control signal for the peripheral circuit.

2. The system as claimed in claim 1, wherein the level shifter is an RS latch.

3. The system as claimed in claim 1, wherein the level shifter is a charge pump.

4. The system as claimed in claim 1, wherein the system comprises a plurality of identical level shifters.

5. The system of as claimed in claim 1, wherein the plurality of control signals are passed through the at least one level shifter.

6. The system as claimed in claim 1, wherein the at least one control signal for the memory circuit is substantially synchronized to the at least one control signal for the peripheral circuit.

7. The system as claimed in claim 1, wherein the at least one control signal for the peripheral circuit is substantially synchronized to the at least one control signal for the memory circuit.

8. A multiple voltage domain system, comprising:
   a control signal generator configured to provide a plurality of control signals for a memory circuit and a peripheral circuit,
   wherein the control signal generator is configured to substantially synchronize at least two of the control signals by causing the at least two control signals to traverse substantially similar voltage domains up to a first voltage level higher than a second voltage level through at least one level shifter and then shifting one of the two control signals down to the second voltage level,
   wherein the at least two control signals include at least one control signal for the memory circuit and at least one control signal for the peripheral circuit, and
   wherein the level shifter is configured to convert an input signal from a periphery supply voltage level (VP) to a core supply (VC) voltage level.

9. A memory device comprising multiple voltage domains, the device comprising:
   a control signal generator configured to provide a plurality of control signals for a memory circuit and a peripheral circuit, wherein at least a few of the control signals including a first control signal having a first voltage level and a second control signal having a second voltage level lower than the first voltage level need to be substantially synchronized,
   wherein the control signal generator is configured to cause the second control signal to traverse a voltage domain up to the first voltage level traversed by the first control signal through an identical level shifter as used with the first control signal and then shift the second control signal down to the second voltage level,
   wherein the first control signal is a control signal for the memory circuit and the second control signal is a control signal for the peripheral circuit.

10. The device as claimed in claim 9, wherein at least one of the level shifters is one of an RS latch and a charge pump.

11. The device as claimed in claim 9, wherein the level shifter producing the second control signal is configured to convert an input signal from a periphery supply voltage level (VP) up to a core supply voltage level (VC) to generate an intermediate signal.

12. The device as claimed in claim 11, wherein the intermediate signal is level shifted from the core supply voltage level down to the periphery supply voltage level to generate the second control signal.

13. The device as claimed in claim 9, wherein the control signal for the memory circuit is substantially synchronized to the control signal for the peripheral circuit.

14. The device as claimed in claim 9, wherein the control signal for the peripheral circuit is substantially synchronized to the control signal for the memory circuit.

15. A method for signal synchronization in a multi-voltage system, the method comprising:
   providing a plurality of control signals for a memory circuit and a peripheral circuit, wherein at least a few of the control signals including a first control signal having a first voltage level and a second control signal having a second voltage that is level lower than the first voltage level need to be synchronized; and
   causing the second control signal to traverse a voltage domain traversed by the first control signal, by passing the first and second control signals through identical level-shift stages each shifting a respective one of the first and second control signals up to the first voltage level and then level shifting the second control signal down to the second voltage level,
   wherein the first control signal is a control signal for the memory circuit and the second control signal is a control signal for the peripheral circuit.

16. The method as claimed in claim 15, wherein at least one of the level shifter is an RS latch.

17. The method as claimed in claim 15, wherein at least one of the level shifter is a charge pump.

18. The method as claimed in claim 15, wherein the control signal for the memory circuit is substantially synchronized to the control signal for the peripheral circuit.

19. The method as claimed in claim 15, wherein the control signal for the peripheral circuit is substantially synchronized to the control signal for the memory circuit.

20. The device as claimed in claim 15, wherein the level shifters are configured to convert an input signal from a periphery supply voltage level (VP) to core supply voltage level (VC), and wherein the core supply voltage level is the first voltage level and the periphery supply voltage level is the second voltage level.

* * * * *

UNITED STATES PATENT AND TRADEMARK OFFICE
CERTIFICATE OF CORRECTION

| | | |
|---|---|---|
| PATENT NO. | : 8,693,267 B2 | Page 1 of 1 |
| APPLICATION NO. | : 12/646827 | |
| DATED | : April 8, 2014 | |
| INVENTOR(S) | : Gupta et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 772 days.

Signed and Sealed this
Ninth Day of February, 2016

Michelle K. Lee
*Director of the United States Patent and Trademark Office*